(12) United States Patent
Kinpara et al.

(10) Patent No.: US 6,186,331 B1
(45) Date of Patent: Feb. 13, 2001

(54) CONTAINER

(75) Inventors: Mineo Kinpara, Hiroshima-ken; Toshio Ishikawa, Tokyo, both of (JP)

(73) Assignees: Dainichi Shoji K.K., Tokyo; Rorze Corporation, Hiroshima-ken, both of (JP)

(*) Notice: Under 35 U.S.C. 154(b), the term of this patent shall be extended for 0 days.

(21) Appl. No.: 09/214,336

(22) PCT Filed: Apr. 6, 1998

(86) PCT No.: PCT/JP98/01575
§ 371 Date: Feb. 24, 2000
§ 102(e) Date: Feb. 24, 2000

(87) PCT Pub. No.: WO99/52140
PCT Pub. Date: Oct. 14, 1999

(51) Int. Cl.[7] .................................................. B65D 85/90
(52) U.S. Cl. .......................... 206/711; 206/454; 417/217
(58) Field of Search .................................. 206/454, 710, 206/711; 211/41.18; 220/324; 414/217, 217.1, 411, 937

(56) References Cited

U.S. PATENT DOCUMENTS

| | | | |
|---|---|---|---|
| 4,739,882 | * | 4/1988 | Parikh et al. ........................ 206/454 |
| 5,320,218 | * | 6/1994 | Yamashita et al. ................ 206/213.1 |
| 5,482,161 | * | 1/1996 | Williams et al. ..................... 206/711 |
| 5,611,452 | * | 3/1997 | Bonora et al. ....................... 206/454 |
| 5,740,845 | * | 4/1998 | Bonora et al. ....................... 206/710 |
| 5,741,109 | * | 4/1998 | Wiesler et al. ...................... 414/937 |
| 5,788,082 | * | 8/1998 | Nyseth ................................. 206/711 |
| 5,810,537 | * | 9/1998 | Briner et al. ......................... 414/937 |
| 5,915,562 | * | 6/1999 | Nyseth ................................. 206/710 |
| 5,957,292 | * | 9/1999 | Mikkelsen et al. .................. 206/710 |
| 6,053,688 | * | 4/2000 | Cheng .................................. 414/217 |

FOREIGN PATENT DOCUMENTS

| | | |
|---|---|---|
| 7-66274 | 3/1995 | (JP) . |
| 8-279546 | 10/1996 | (JP) . |

* cited by examiner

*Primary Examiner*—Jim Foster
(74) *Attorney, Agent, or Firm*—Cantor Colburn LLP

(57) ABSTRACT

A container for receiving a detesting dust article and transporting thereof, which is mounted on a loader disposed in a border portion between a high cleanliness room and a low cleanliness room, including means by the use of which a cover thereof is opened and closed by an opener mechanism to communicate and shut the opening portion thereof and the high cleanliness room.

9 Claims, 11 Drawing Sheets

(A)

(B)

CONTAINER

BACKGROUND OF THE INVENTION

1. Field of the Invention

The present invention relates to a container for receiving and transporting an article such as a substrate necessary to be kept under the condition of high cleanliness during being transported. There is described hereunder a container in relation to a semiconductor substrate such as a silicon wafer or a liquid crystal substrate as the above article, in particular a silicon wafer as an example, however, the present invention is not limited to the above article. The container of the present invention is applicable to any kind of article necessary to be kept under the condition of high cleanliness during being transported.

2. Background of the Invention

The semiconductor substrate, in particular silicon wafer is contaminated when dust or vaporized organic compounds (hereinafter referred to as "dust") are attached thereto, thus leading to a lower productivity, i.e., the rate of producing products with high-quality is low. It is therefore necessary to maintain high cleanliness in the surroundings of the silicon wafer when the silicon wafer is transported. More specifically, the silicon wafer is one of the articles necessary to be kept under the condition of high cleanliness during transported (hereinafter referred to as a "detesting dust article").

In general, the silicon wafer is worked in a room where cleanliness is high (hereinafter referred to as a "high cleanliness room"), i.e., so called a clean room. On the other hand, when the silicon wafer is transported, the silicon wafer is received in an airtightly sealed container, the inside of which is kept under the condition of high cleanliness (hereinafter referred to as a "container"), and then, the container with the silicon wafer received therein is transported. Thus, the silicon wafer can be transported through a room in which the degree of cleanliness is low or outdoor (hereinafter referred to as a "low cleanliness room"), avoiding the silicon wafer from being contaminated by dust or the like during transported.

There is disposed a loader having an opening portion, which opening portion can be closed, in the border portion between the high cleanliness room and the low cleanliness room. The silicon wafer is moved through the above loader from the inner space of the container with high cleanliness to the high cleanliness room, then worked therein (hereinafter referred to as "loading"). In addition, the silicon wafer is moved through the loader from the high cleanliness room to the inner space of the container with high cleanliness, then transferred to another treatment step (hereinafter referred to as "unloading").

More specifically, the silicon wafer is loaded or unloaded through the above opening portion of the loader. The container has a cover (i.e., lid) in a direction to the opening portion of the loader, which cover is opened when the silicon wafer is loaded or unloaded.

When the silicon wafer is not loaded or unloaded, the opening portion of the loader is kept closed so as to prevent dust from floating into the high cleanliness room from the low cleanliness room. A door may be disposed in the opening portion so that the opening portion can be opened or closed by the door.

In this case, the door may be large enough to completely close the opening portion of the loader. In addition, the door may be the size in which the door is about 5 mm smaller in each side than the respective side of the opening portion of the loader in such manner that there is provided aperture (open space) between the door and the opening portion of the loader, while the air pressure in the high cleanliness room is kept higher than that in the lower cleanliness room, thus air flows through the aperture from the high cleanliness room to the low cleanliness room.

The following standards for the above container and loader are proposed and applied: SEMI (Semiconductor Equipment and Material International) Standard E47.1 [Box/Pod (FOUP)], E15.1[Tool Load Port], E57[Kinematic Coupling], E62[Front-Opening Interface Standard (FIMS), E63 [Box/Opener to Tool Standard (BOLTS) and the like (hereinafter referred to as "Standard").

RELATED ART

An example of the conventional container is described in FIG. 1 as for reference.

There is formed an opening portion 103 at the frontal portion of the container 102, which opening portion 103 is opened and closed by a cover 105. There is fixed a part named as a teeth 109 on the inner wall of the container, which holds a plurality of silicon wafers 107 in parallel and horizontally within the container 101.

There is formed key holes 111 on the outer surface of the cover 105, to which an opener mechanism disposed on the loader is applied. More specifically, keys of the opener mechanism are inserted into the key holes 111 and turned to cause the lock mechanism disposed in the cover 105 to operate. As a result, four locking pawls 115 in the lock mechanism, which protrude from four window portions 113 provided in the frame portion of the opening portion 103, move backward in such manner that the locking pawls are released from recessed portions 117 provided on the frame portion of the container in the opening portion 103, thus the locking is disengaged. Then, the cover 105 is removed from the frame portion of the container in the opening portion 103.

However, according to the conventional container, when the lock mechanism comprising gears, cams and the like is operated, dust is generated to flow out of the window portions 113 in the frame portion of the cover 105. The thus generated dust flows into the inside of the container by the air stream generated at the instant when the locking pawls 115 are disengaged and the cover 105 is released, thus contaminating the silicon wafer 107 in the container. More specifically, there is caused to occur the difference in air pressure between the high cleanliness room and the inside of the container 101 by the positive pressure applied to the high cleanliness room at the instant when the cover 105 is released, thus producing the air stream. The dust is carried by the air stream toward the inside of the container 101 and then contaminates the inside thereof.

There is described the structure around the hitched portion 117 in more detail with reference to FIG. 1(B). The frame portion of the container 101 in the opening portion 103 protrudes forward so as to form flange 119. More specifically, the front end of the flange 119 forms the front end of the frame portion of the container in the opening portion 103. The recessed portion which is the hitched portion 117 is formed on the inner surface of the flange 119. Accordingly when the lock mechanism is operated to be engaged, both of the locking pawls 115 and windows portions 113 are located inward of the front end of the flange 119. The air stream is separated at the front end of the flange 119 into two streams comprising an outer stream (lower stream) and an inner stream (upper stream), as shown in FIG. 1(B) by arrows. The inner stream passes along the inner surface of the flange 119 to carry the dust discharged from the window portions 113 through the space between the frame portion of the cover 105 and the flange 119 to the inside of the container, thus contaminating the inside of the container 101.

Furthermore, in addition to the dust generated in the lock mechanism, the dust generated by the friction between the locking pawl and the hitched portion 117 also contaminates the inside of the container.

Furthermore, when the inner surface of the flange 119 in the opening portion 103 is scraped by the frame portion of the cover 105, dust is generated, thus contaminating the inside of the container 101.

The present invention is proposed to solve the above problems in the conventional container. The purpose of the present invention is therefore to provide a container for receiving and transporting the detesting dust article which can remarkably reduce the dust generated when the cover of the container is opened and closed, and prevent the inside of the container from being contaminated by the dust.

DISCLOSURE OF THE INVENTION

In order to attain the above object, there is provided a following invention.

There is provided a first embodiment of the invention, which is a container for receiving and transporting a detesting dust article, which is mounted on a loader disposed in a border portion between a high cleanliness room and a low cleanliness room, a cover of which is opened and closed by an opener mechanism disposed in said loader in such manner that an opening portion of said container and said high cleanliness room is connected and shut, which includes:

(a) a lock mechanism disposed in said cover and operated by said opener mechanism provided in said loader for locking and releasing said cover;

(b) a locking pawl in said lock mechanism for protruding from a frame portion of said cover and catching a hitched portion provided in a frame portion of said container in said opening portion; and (c) a window portion provided in said frame portion of said cover, from which said locking pawl protrudes, said window portion being disposed so as to be located outward and backward of an front end of said frame portion of said container in said opening portion, when said locking pawl is hitched to said hitched portion provided in said frame portion of said container in said opening portion.

According to the invention, since the window portion is located outward and backward from a tip of the opening portion, the dust generated during the operation of the lock mechanism and flowed out of the window portion is carried to the low cleanliness room by the air stream generated at the instance when the pawls are disengaged and the cover is released, thus preventing the dust from flowing backward through the tip of the opening portion to the inside of the container not to contaminate the inside of the container.

The second embodiment of the invention is a container, wherein said frame portion of said container in said opening portion includes an inner flange, an outer flange and said hitched portion which is located between said inner flange and said outer flange, said window portion for said locking pawl is located in said hitched portion when said locking pawl is hitched to said hitched portion, and said front end of said frame portion of said container in said opening portion comprises a tip of said inner flange.

According to the invention, since a dead-end space is provided between the inner flange and the outer flange in which space the air stream is hardly generated, it is possible to prevent the dust from flowing backward through the tip of the opening portion to the inside of the container.

Third embodiment of the invention is a container for receiving and transporting a detesting dust article, which is mounted on a loader disposed in a border portion between a high cleanliness room and a low cleanliness room, a cover of which is opened and closed by an opener mechanism disposed in said loader in such manner that an opening portion of said container and said high cleanliness room is connected and shut, which includes:

(a) a lock mechanism disposed in said cover and operated by said opener mechanism provided in said loader for locking and releasing said cover;

(b) a locking pawl in said lock mechanism for protruding from a frame portion of said cover and catching a hitched portion provided in a frame portion of said container in said opening portion;

(c) a window portion provided in said frame portion of said cover, from which said locking pawl protrudes, said window portion being disposed so as to be located outward of an front end of said frame portion of said container in said opening portion, when said locking pawl is hitched to said hitched portion provided in said frame portion of said container in said opening portion; and (d) a vent hole provided in said frame portion of said container outward of said front end of said frame portion of said container for connecting to said low cleanliness room.

According to the invention, the dust generated during the operation of the lock mechanism and flowed out of the window portion is carried to the low cleanliness room by the air stream generated at the instance when the pawls are disengaged and the cover is released, thus preventing the dust from flowing backward through the tip of the opening portion to the inside of the container not to contaminate the inside of the container.

The fourth embodiment of the invention is a container, wherein said hitched portion comprises an engaged hole, and said engaged hole functions as said vent hole.

According to the invention, numbers of the vent holes and engaged holes may be reduced to facilitate the manufacture of the container.

The fifth embodiment of the invention is a container for receiving and transporting a detesting dust article, which is mounted on a loader disposed in a border portion between a high cleanliness room and a low cleanliness room, a cover of which is opened and closed by an opener mechanism disposed in said loader in such manner that an opening portion of said container and said high cleanliness room is connected and shut, which includes:

(a) a lock mechanism disposed in said cover and operated by said opener mechanism provided in said loader for locking and releasing said cover;

(b) a locking pawl in said lock mechanism for protruding from a frame portion of said cover and catching a hitched portion provided in a frame portion of said container in said opening portion;

(c) a window portion provided in said frame portion of said cover, from which said locking pawl protrudes, said window portion being disposed so as to be located at a portion through which air stream flows directly toward said low cleanliness room, said air stream being generated by a positive pressure applied to said high cleanliness room at an instance when said locking pawl is disengaged from said hitched portion to release said cover.

According to the invention, the dust generated during the operation of the lock mechanism and flowed out of the window portion is directly carried to the low cleanliness room by the air stream generated at the instance when the pawls are disengaged and the cover is released, thus preventing the contamination of the inside of the container.

The sixth embodiment of the invention is a container for receiving and transporting a detesting dust article, which is mounted on a loader disposed in a border portion between a high cleanliness room and a low cleanliness room, a cover of which is opened and closed by an opener mechanism disposed in said loader in such manner that an opening portion of said container and said high cleanliness room is connected and shut, which includes:

(a) a taper-shaped guiding convex portion or a taper-shaped guiding concave portion formed at a portion on an inner side of said cover with which said frame portion of said container in said opening portion contacts;

(b) a taper-shaped guiding concave portion or a taper-shaped guiding convex portion for being correspondingly fixed to said taper-shaped guiding convex portion or said taper-shaped guiding concave portion formed in said cover, formed at a portion on said frame portion of said container in said opening portion with which said inner side of said cover contacts.

According to the invention, since the cover closes the opening portion while the taper-shaped guiding convex portion is fixed to the guiding concave portion to determine the location, the cover is not erroneously contacted with the opening portion, thus preventing the dust from being generated.

The seventh embodiment of the invention is a container for receiving and transporting a detesting dust article, which is mounted on a loader disposed in a border portion between a high cleanliness room and a low cleanliness room, a cover of which is opened and closed by an opener mechanism disposed in said loader in such manner that an opening portion of said container and said high cleanliness room is connected and shut, which includes:

(a) an inner flange formed at an inner side of a frame portion of said container in said opening portion and an outer flange formed at an outer side of said frame portion of said container in said opening portion;

(b) said cover closing said opening portion by covering an inner side of said outer flange;

(c) a ring-shaped concave portion formed at an inner side of said cover for being fixed to said inner flange; and (d) a gap formed between an inner surface of said inner flange and an inner wall at an inner side of said ring-shaped concave portion.

According to the invention, since the gap is formed between the inner peripheral surface of the inner flange and the inner wall at the inner peripheral side of the concave portion, it is possible to prevent two of them from contacting each other, thus preventing the dust from being generated within the opening portion.

The eighth embodiment of the invention is a container, wherein a kinematic coupling is disposed between said opener mechanism and said cover, which cover is closed and opened by said opener mechanism, for positioning of said opener mechanism and said cover.

According to the invention, since the determination of the location of the cover against the opener mechanism is carried out by the kinematic coupling, the cover is prevented from erroneously contacting with the opening portion, thus preventing the generation of the dust.

DETAILED DESCRIPTION OF PREFERRED EMBODIMENTS

The best mode of the embodiments of the invention is described hereunder with reference to FIGS. 2 to 11. The following embodiments do not limit the scope of the invention. Skilled person in the field can therefore execute other embodiments within a scope of the invention according to the present invention.

[Relationship between the container and the loader]

There is described the process for opening and closing the cover of the container of the invention by the loader so as to connect and shut the opening portion of the container to the high cleanliness room.

Figure 1:
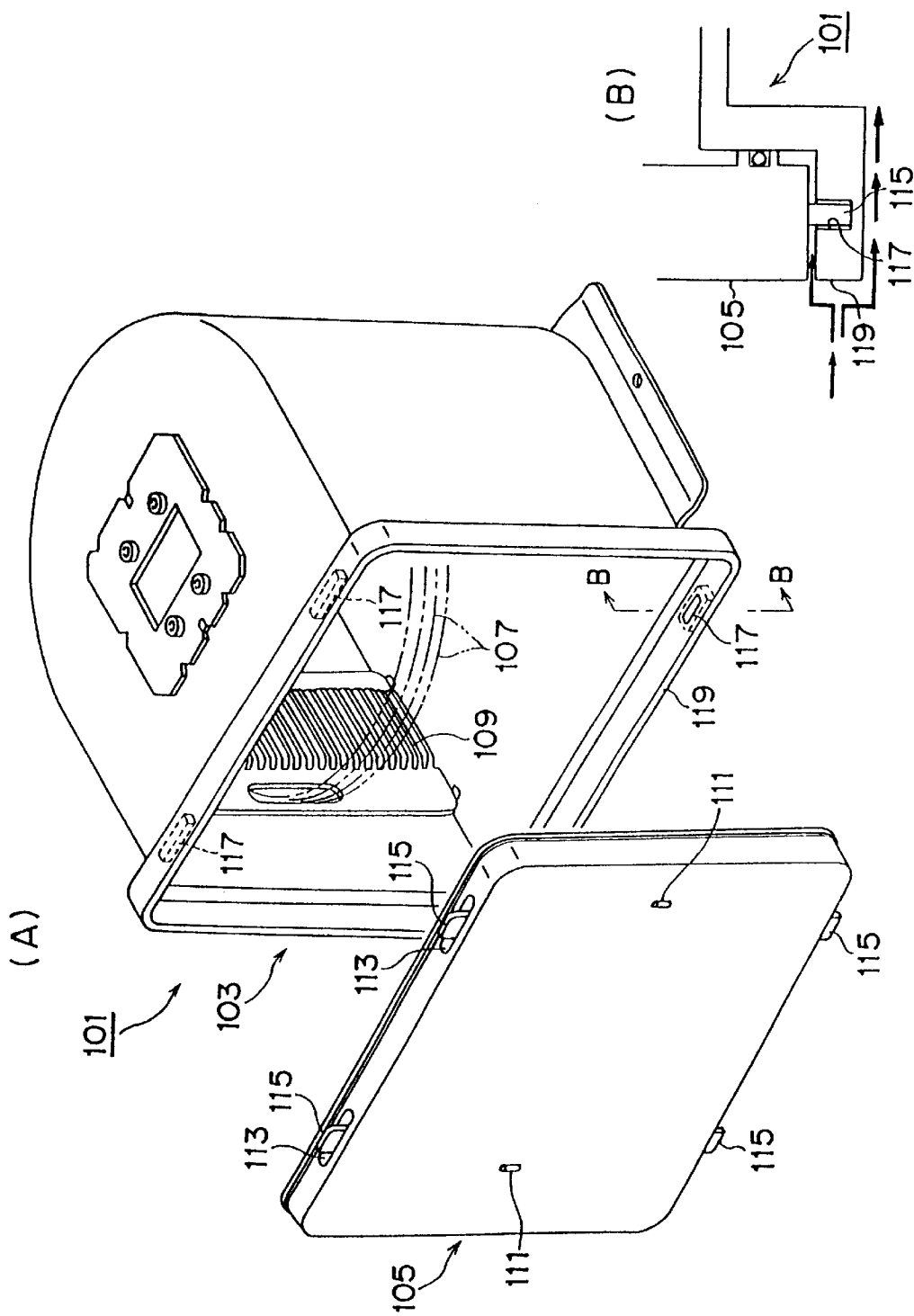
FIG. 1(A) is a schematic oblique view illustrating a conventional container.
FIG. 1(B) is a B—B cross sectional view in FIG. 1(A) illustrating frame portions of the cover and the container, when the cover is closed.
Figure 2:
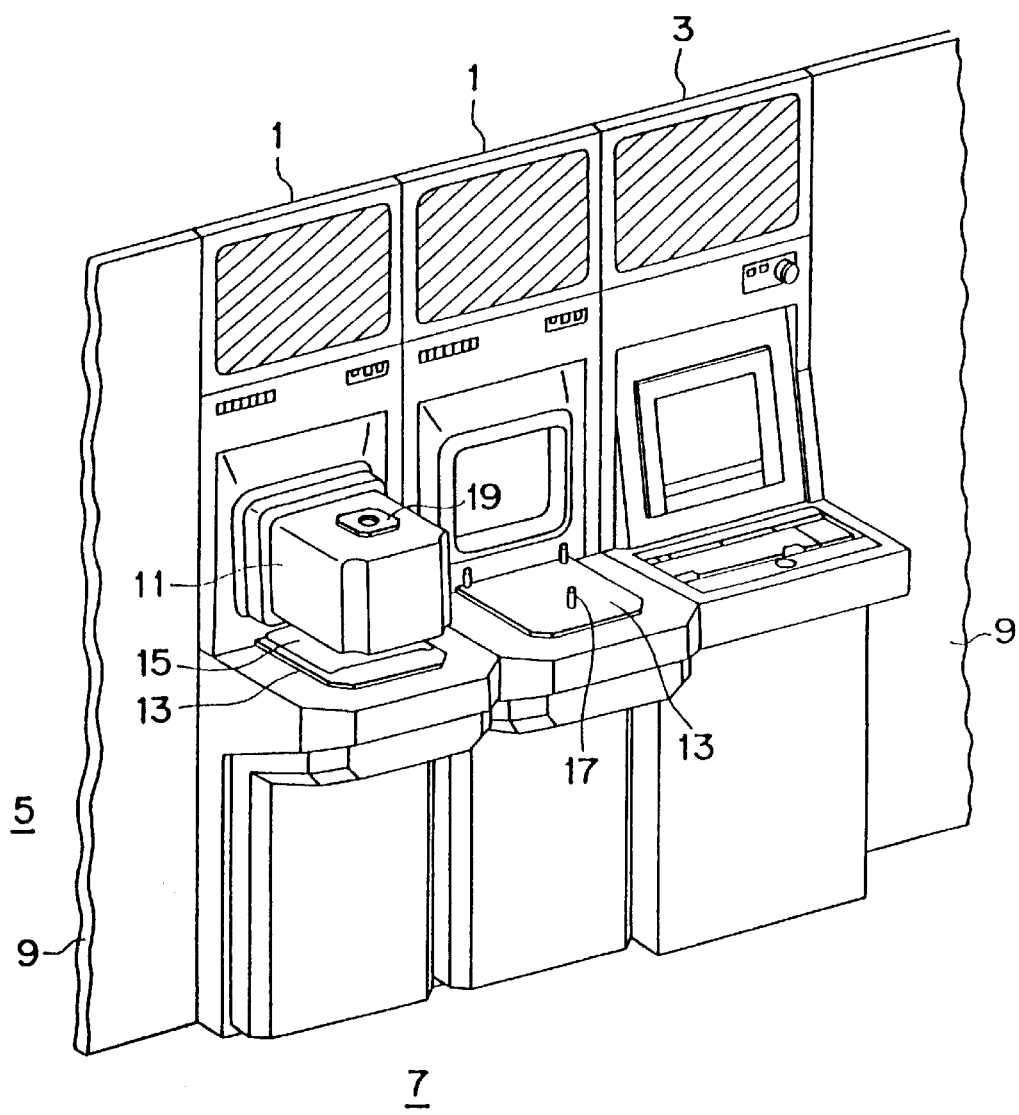
FIG. 2 is a schematic oblique descriptive view observed from the low cleanliness room, which illustrates the loader with the container of the first embodiment of the invention mounted thereon.

As shown in FIG. 2, two loaders 1 and one control panel 3 are disposed on the wall 9 installed at the border portion between the high cleanliness room 5 and the low cleanliness room 7. One of the loader 1 is assigned to the use only for carrying the silicon wafer into the high cleanliness room (i.e., loading), and the other loader 1 is assigned to the use only for carrying the silicon wafer out of the high cleanliness room (i.e., unloading), for example, thus the silicon wafer is smoothly carried into and out of the high cleanliness room along one circulating route.

Container 11 is mounted on the stage 13 of the loader 1, followed by the positioning thereof. The positioning of the container and the stage is carried out by the kinematic coupling provided on the stage and the base portion 15 of the container (the member indicated by the numerous number 17 in FIG. 2 is a male member which is a part of the kinematic coupling).

The container may be mounted by man power, or the transporting robot or the robot mounted on AGV running on the floor. Furthermore, the flange 19 may be disposed on the upper portion of the container 11 in such manner that the container may be mounted by the transporting robot installed on the ceiling. The process defined in the standard can be applied to mount the container.

Figure 3:
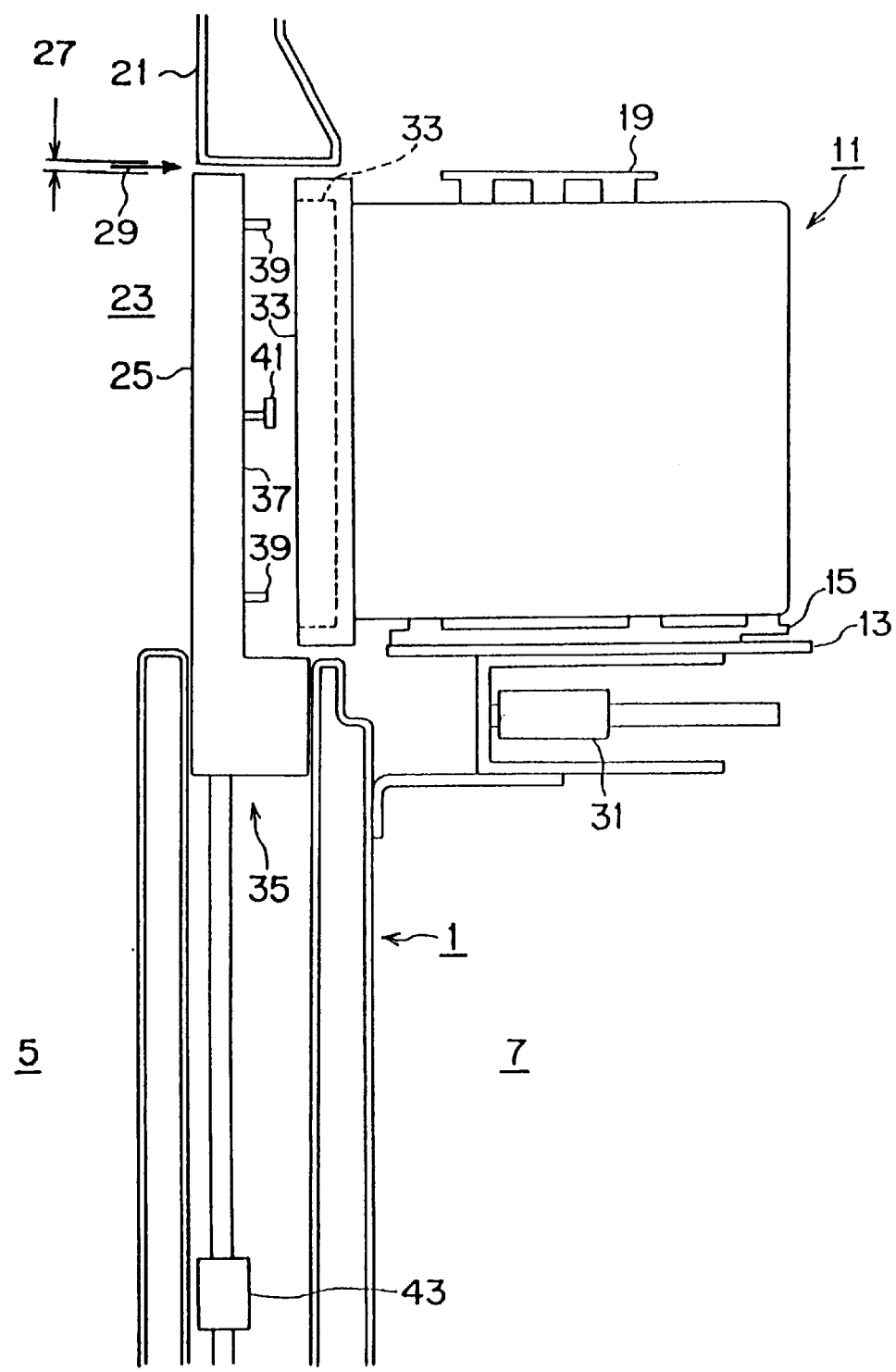
FIG. 3 is a vertical sectional view of the loader and the container in FIG. 2 which illustrates the loader and the container before the cover is released from the main body of the container.
Figure 4:
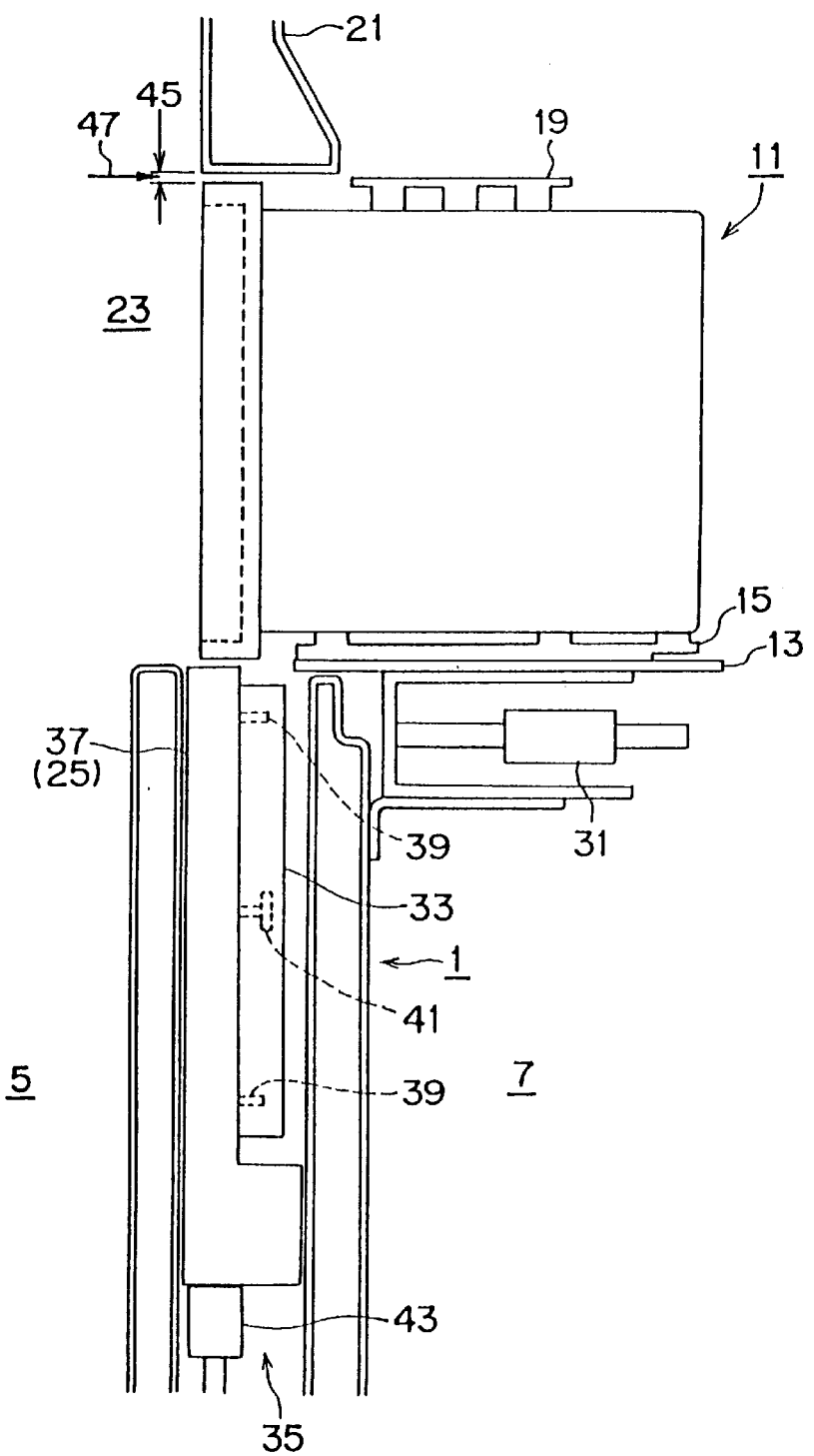
FIG. 4 is a vertical sectional view of the loader and the container in FIG. 2 which illustrates the loader and the container in which the cover is released from the main body of the container of the invention and the opening portion of the container is connected to the high cleanliness room.

In addition, the process defined in the standard can be applied to the positioning of the container by means of the kinematic coupling In FIG. 3, an opening portion 23 is formed on the wall 21 toward which the front of the container 11 mounted on the loader 1 faces. The opening portion 23 is covered by the door 25 called as a closure. The gap between the door and the opening portion 23 is not necessarily perfectly sealed, and a specific space 27 is formed and opened. By the positive pressure applied to the high cleanliness room 5, the air stream 29 is generated from the high cleanliness room to the low cleanliness room 7 through the specific space 27, thus the dust can be prevented from flowing into the high cleanliness room by the air stream 29.

Firstly, the stage 13 on which the container 11 is mounted is caused to approach the door 25 by a driving mechanism 31. The door 25 also functions as the opener 37 which is a part of the opener mechanism 35 for opening and closing the cover 33 of the container 11.

More specifically, the kinematic coupling is disposed on the side of the opener 37 facing toward the cover 33 of the container 11 in the low cleanliness room 7, to carry out the positioning (the member indicated by numerous number 39 in FIG. 3 is a male member which is a part of the kinematic coupling). In addition, the cover 33 is fixed to the opener 37 by fixing means (not shown). Furthermore, the key 41 disposed in the opener 37 is inserted to the key hole disposed in the cover while the cover is fixed to the opener by the above-mentioned fixing means, and then the key 41 is turned so as to cause the lock mechanism disposed inside of the cover to operate. As a result, the locking pawls in the lock mechanism in the cover are released from the hitched portion provided in the frame portion of the container 11 in the opening portion.

Then, the stage on which the container 11 is mounted moves backward a little, while the cover 33 is fixed to the opener 37. By this backward movement of the stage, the cover 33 is released from the container 11 so that the container 11 is opened at the opening portion thereof.

Then, the opener 37 with the cover 33 fixed thereto is lowered into the loader 1 by the driving mechanism 43 provided in the opener mechanism 35. Then, the stage on which the container 11 is mounted moves forward again. By this forward movement of the stage, the opening portion of the container 11 is connected to the high cleanliness room through the opening portion 23 of the wall 21 (refer to FIG. 4). At this moment, the prescribed space 45 is formed between the frame portion of the container 11 in the opening portion and the opening portion 23 of the wall, through which the air stream 47 is generated from the high cleanliness room 5 to the low cleanliness room 7, thus the dust in the low cleanliness room is prevented from flowing into the high cleanliness room 5.

The silicon wafer as the detesting dust article is loaded into the high cleanliness room 5 from the inside of the container 11, and worked therein. After worked, the silicon wafer may be unloaded out of the high cleanliness room 5 to the container 11 which is mounted on another loader 1, or to the container 11 which is mounted on the same loader 1. The above-mentioned loading and unloading of the silicon wafer is carried out by the known means such as a scalar type robot for clean room installed in the high cleanliness room 5.

When the silicon wafer is moved out of the high cleanliness room to the container 11, the reverse processes of the loading of the silicon wafer into the high cleanliness room are carried out. More specifically, the stage 13 on which the container 11 is mounted moves backward. Then, the opener 37 with the cover 33 fixed thereto is raised by the driving mechanism 43 of the opener mechanism 35 to return to the initial position. Then, the stage 13 moves forward a little again so that the cover 33 of the container covers the opening portion of the container 11. Then, the key 41 of the opener 37 is turned in reverse to cause the locking pawls in the lock mechanism to engage the hitched portion, thus locking and sealing the opening portion of the container 11 by the cover 33. Then, after the fixing means of the opener 37 releases the cover, the stage 13 is moved backward again, thus the container 11 is ready to be carried in the low cleanliness room 7.

[Construction of the container]

Examples of the best mode of the container of the invention is described hereunder with reference to FIGS. 5 to 11.

Figure 5:
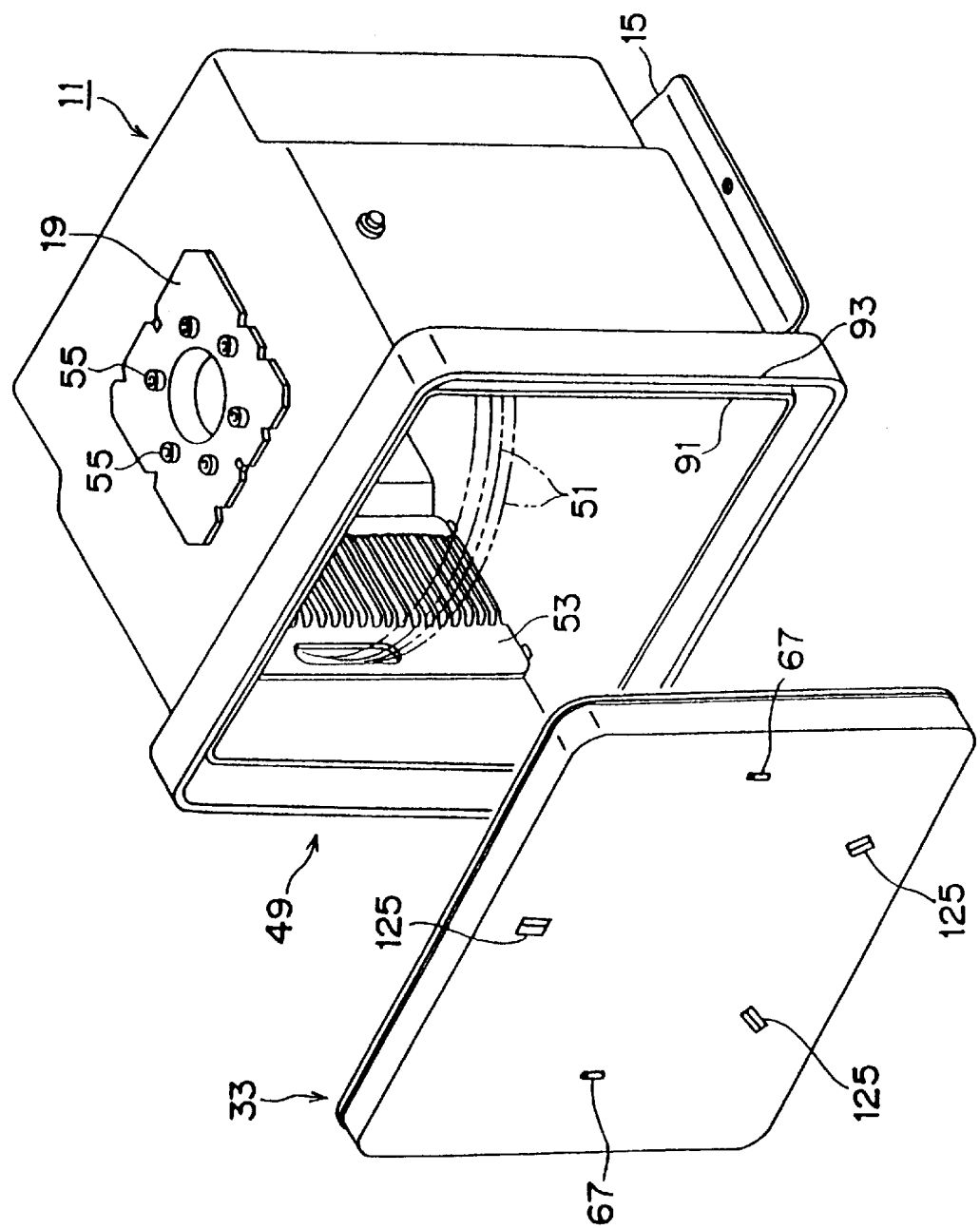
FIG. 5 is an oblique descriptive view illustrating an embodiment of the container of the present invention in its entirety.

(General description) As shown in FIG. 5, the container 11 of this embodiment comprises a schematic box type container, in the front portion of which the square frame portion is formed in the opening portion. The inside of the container 11 is used for the space to receive the silicon wafer 51 as the detesting dust article. On the three inner walls of the container, i.e., the right and left sides, and the back side, the parts called as the teeth 53 and the stopper 54 (refer to FIG. 6) are furnished to horizontally hold a plurality of silicon wafers, each of which is parallel each other. On the upper surface of the outside of the container, the flange 19 is fixed by a plurality of screws 55 in such manner that the flange is parallel to the upper surface of the container with a prescribed distance apart therefrom. The flange 19 is held by the transporting robot in the ceiling. The base portion 15 is fixed on the bottom outer surface of the container. The kinematic coupling for carrying out the positioning of the container together with the stage 13 of the loader 1 (refer to FIG. 2) is furnished on the base portion 15. More specifically, there is furnished on the base portion 15, the female member 57 having a V-shaped groove (refer to FIG. 6) to receive a rod-shaped protrusion as the male member 17 which is a part of the kinematic coupling (refer to FIG. 2). Three pairs of the above-mentioned female member 57 and the male member 17 are provided in such manner that three lines formed by the bottom tips of the V-shaped grooves are extended so as to cross at the single point in the center portion of the base portion 15. By this arrangement of the kinematic coupling, the positioning of the container is correctly carried out.

Figure 6:
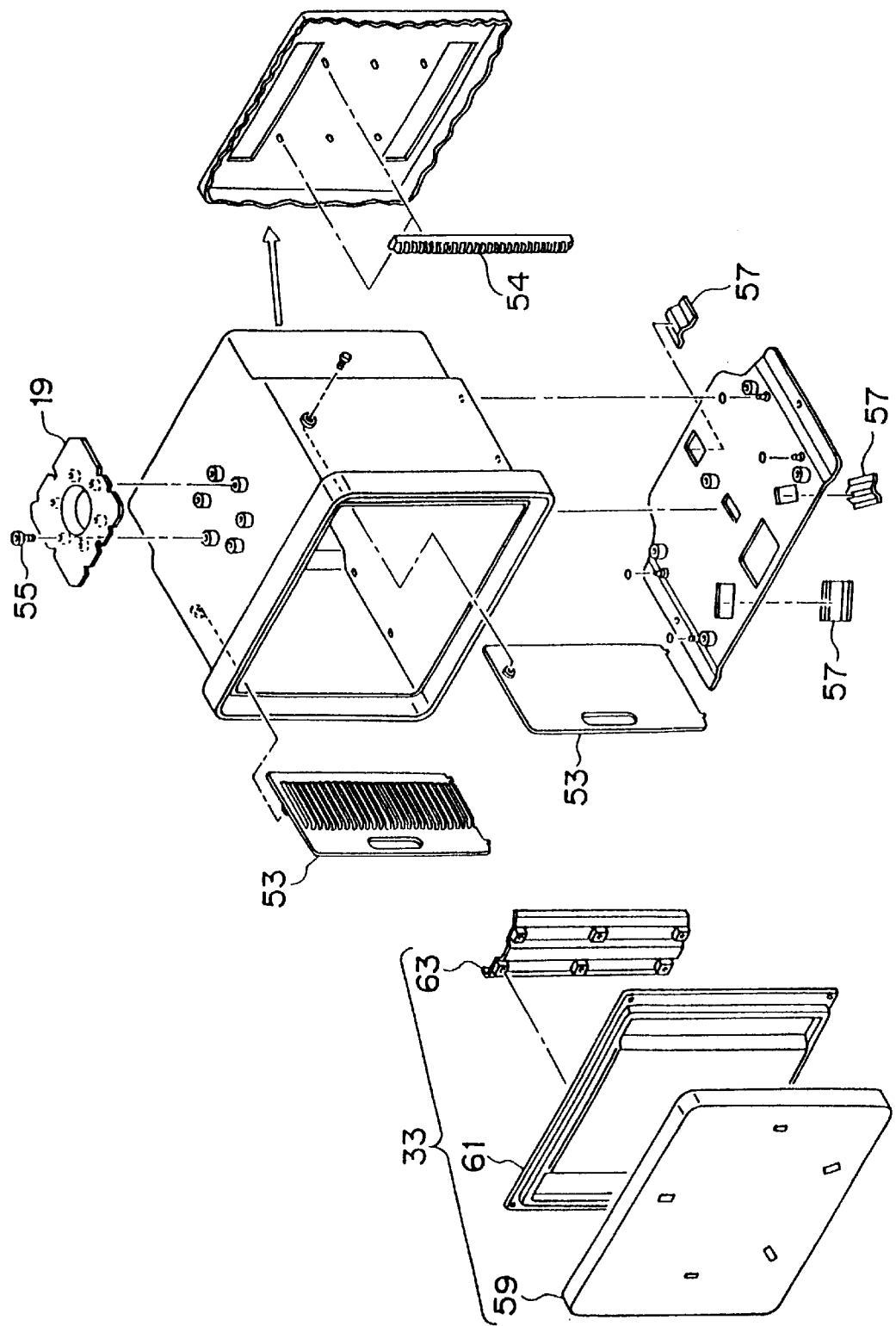
FIG. 6 is a schematic oblique descriptive view illustrating an embodiment of the container of the present invention shown in FIG. 5 in which parts of the container are disassembled.

The cover 33 for opening and closing the opening portion 49 of the container comprises a double structure of the outer cover 59 and the inner base 61 (refer to FIG. 6). The holder 63 for holding the silicon wafers at the front side of the container is further furnished at the inner side of the base 61 (refer to FIG. 6), to hold and fix the plurality of silicon wafers which are placed in parallel each other so as not to move or slide during the transportation thereof (Lock mechanism)

Figure 7:
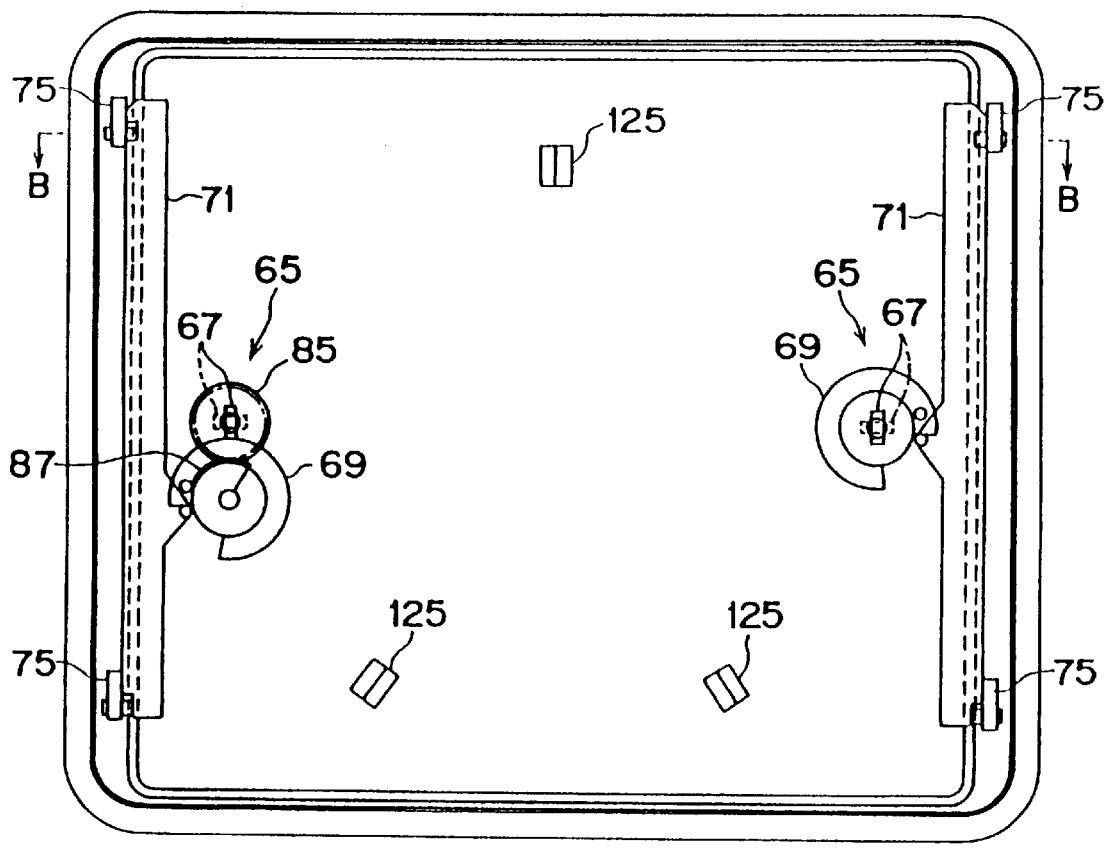
FIG. 7(A) is a perspective view from the front, which illustrates the cover of the container of the invention.
FIG. 7(B) is a B—B cross-sectional view in FIG. 7(A)
Figure 7:
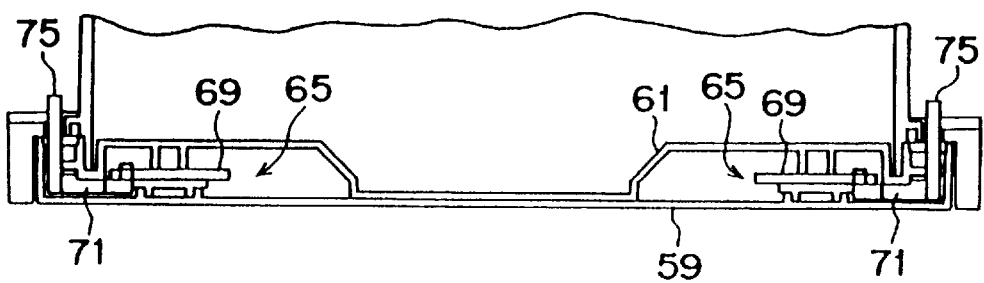
Figure 8:
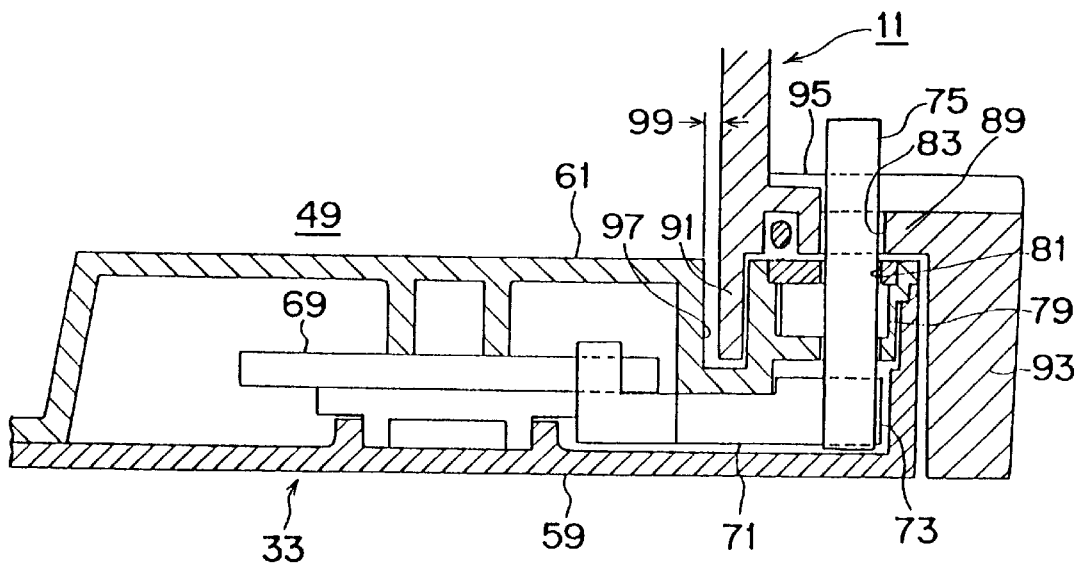
FIG. 8 is a descriptive enlarged view illustrating an essential portion in FIG. 7(B)
Figure 9:
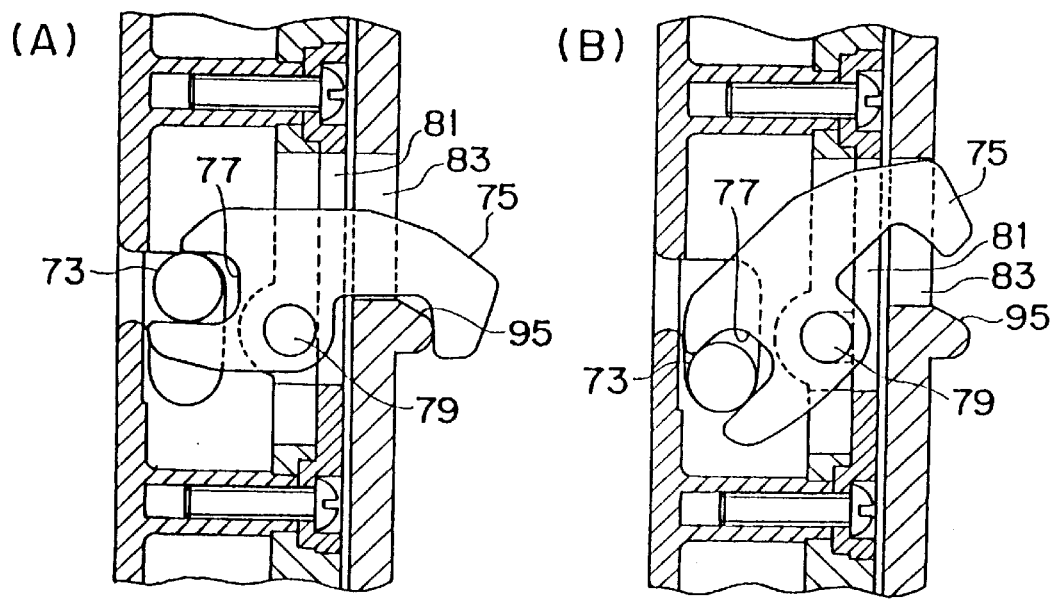
FIG. 9(A) is a perspective view observed from the right side in FIG. 8.
FIG. 9(B) is a descriptive view illustrating the situation in which the locking pawl in lock mechanism is disengaged from the hitched portion in FIG. 9(A)

As shown in FIGS. 7 and 8, the lock mechanism 65 is disposed in the space between the outer cover 59 and the base 61 of the cover 33. The lock mechanism is described more specifically with reference to the lock mechanism 65 in the right side in FIG. 7. The cam 69 with the key hole formed is disposed so as to turn around the key hole. The key hole of the cam 69 is formed to be correspondingly connected to the key hole 67 (refer to FIG. 5) provided in the outer cover 59 in the cover 33. Next to the cam 69, there is provided a slider 71 which can be slid vertically, i.e., up and down, by the cam 69. At each of the upper and lower ends of the long slider 71, there is formed a cylindrical protrusion 73. The cylindrical protrusion 73 is engaged in the U-shaped cut portion 77 which is formed at the rear end of the locking pawl 75. The locking pawl 75 protrudes from the window portion 81 formed in the frame portion of the base 61 which is a part of the cover 33, so as to enable to turn around the turning axis 79. The locking pawl protrudes backward from the front side of the cover in such manner that the locking pawl is inserted to the engaged hole 83 which is the hitched portion provided in the frame portion of the container 11 in the opening portion 49.

The lock mechanism 65 in the left side in FIG. 7 includes an idle gear 85 in contrast with the lock mechanism 65 in the right side in FIG. 7. This arrangement is made to cause two keys 47 to turn in the same direction, each of which keys is inserted to respective key hole 67 and turned. The key hole 67 is formed in the idle gear 85 so that the right and left sliders 71 can be synchronously sled in vertical direction by means of the cam 69 which includes gear 87 engaging the idle gear 85 in the same axis thereof.

(Cover and the frame portion of the opening portion)

The cover 33 and the frame portion of the container in the opening portion 49 are described in detail with reference to FIG. 8. In the frame portion of the container in the opening portion 49, there is disposed a base portion 89 which extends outwardly the frame portion. At the inner side of the base portion 89, there is formed an inner flange 91, and at the outer side of the base portion 89, there is formed an outer flange 93. The cross-sectional view of the above inner and outer flanges and the base portion makes the reverse U-shape. At the rear portion of the reverse U-shape, i.e., the base portion 89, the engaged hole 83 as the hitched portion is formed. The protrusion 95 is formed outwardly at the lowest end of the engaged hole 83. The peak of the protrusion 95 makes a moderate curved surface. The locking pawl 75 is engaged with the above curved surface of the protrusion 95 so as to firmly seal the cover 33 (refer to FIG. 9). Four engaged holes 83 are disposed correspondingly to four locking pawls 75.

In the frame portion of the base 61 which is a part of the cover 33, there is provided a concave portion 97 which houses therein the inner flange 91 of the frame portion of the container 11 in the opening portion 49. Furthermore, the frame portion of the base 61 of the cover 33 has such a shape in the cross section that the frame portion is approximately housed by the reverse U-shape portion comprising the inner flange 91, the base portion 89 and the outer flange 93 of the frame portion of the container 11 in the opening portion 49. It is designed that a prescribed gap 99 is formed between the inner surface of the inner flange 91 (i.e., inner side of the container) and the inner wall at the inner side of the ring-shaped concave portion 97, when the frame portion of the cover is housed by the reverse U-shaped portion of the frame portion of the container in the opening portion.

Figure 10:
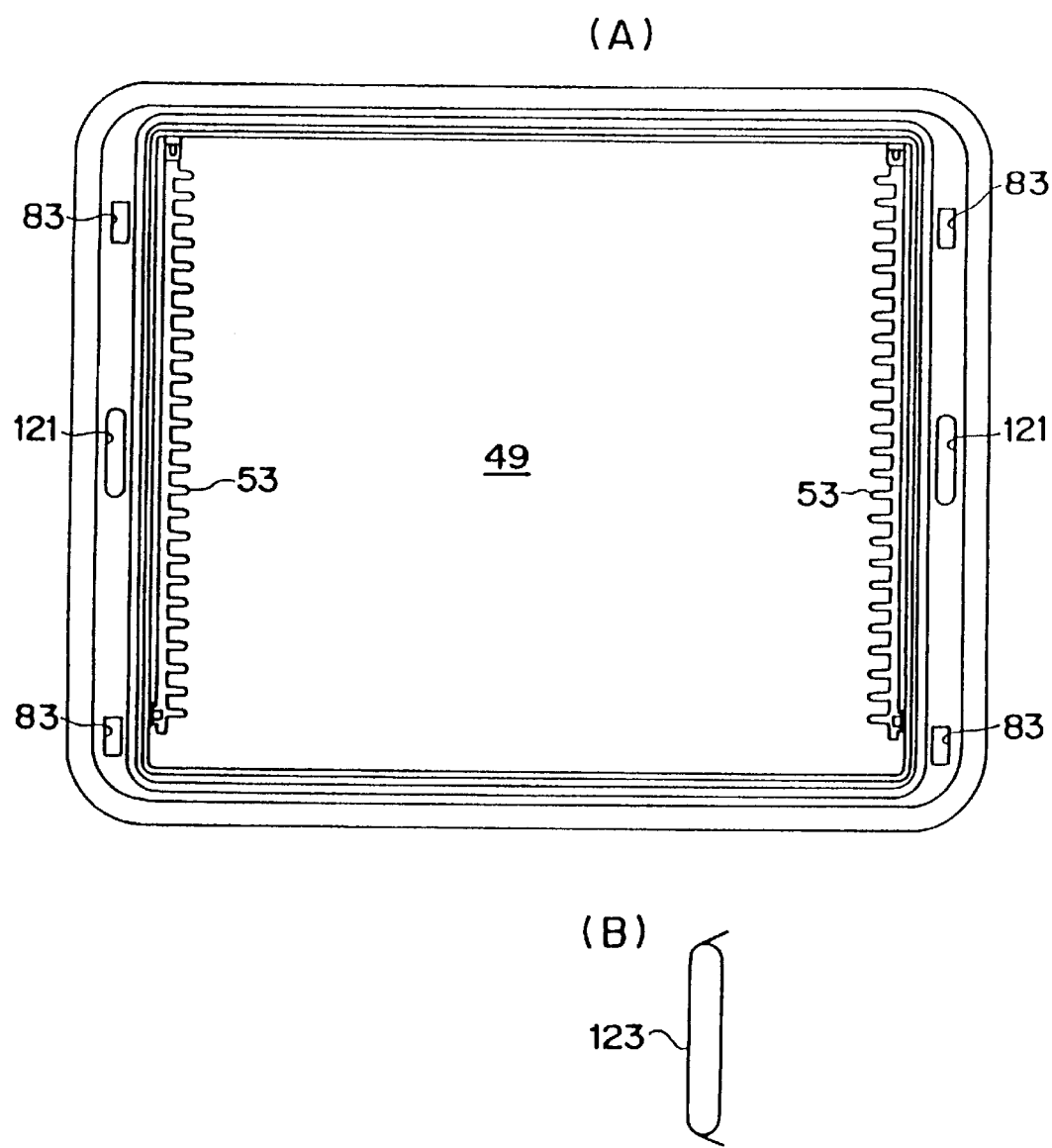
FIG. 10(A) is a frontal descriptive view illustrating the frame portion of the container in the opening portion in FIG. 5.
FIG. 10(B) is a schematic oblique descriptive view of the guiding convex portion formed on the inner side of the cover so as to be correspondingly fixed to the guiding concave portion in FIG. 10(A)

As shown in FIG. 10, in the right and left frame portions of the opening portion 49, there are formed guiding concave portions 121 at the intermediate location between the upper and lower engaging holes 83. In the inner frame portion of the cover 33, there are formed guiding convex portions 123 so as to be engaged with the above-mentioned guiding concave portion 121. The guiding concave portion 123 has a tapered shape which makes smaller toward the depth thereof, while the guiding convex portion 121 has a tapered shape which makes smaller toward the tip thereof, correspondingly.

(Positioning of the cover and the opener)

There is provided the kinematic coupling to carry out the positioning between the cover 33 and the opener 37 (refer to FIG. 3). More specifically, there are formed three V-shaped grooves 125 (refer to FIG. 5) as the female member on the outer cover 59 of the cover 33, which correspond to the three rod type protrusions as the male member 39 formed in the opener 37 which is a part of the kinematic coupling. Since the kinematic coupling functions as approximately same as the kinematic coupling provided in the base portion 15, the detail description thereof is found in the above-mentioned base portion.

(Scale of the gap between the opening portion of the wall and the container)

As shown in FIG. 11(A) which schematically represents the relationship between the frame portions of the cover and the frame portion of the container in the opening portion shown in FIG. 8 together with the opening portion 23 of the wall, the scale of the gap 45 between the opening portion 23 of the wall 21 and the container, namely, the gap 45 between the outer surface of the outer flange 93 and the inner surface of the opening portion 23 of the wall 21 is within a range of 4 to 6 mm, preferably 5 mm. The length 127 thereof along the air stream 47 is within a range of 10 to 20 mm, preferably 15 mm. According to the conventional apparatus, the above-mentioned length along the air stream is too short so that a turbulent flow is generated in the air stream after passing the gap 45, thus drawing the dust in the low cleanliness room 7 and causing the dust to flow into the high cleanliness room 5. Contrary to the conventional apparatus, in the present invention, the length of the gap 45 is long enough so that the air stream makes a laminar flow, and the turbulent flow in the air stream is effectively prevented from being generated, thus the dust is prevented from flowing into the high cleanliness room 5.

The cleanliness in the high cleanliness room 5 is 5 Class1, while the cleanliness in the low cleanliness room is 7 Class1.

The pressure in the high cleanliness room 5 is higher than that in the low cleanliness room 7 by for example 35 Pa.

[Function and effect]

From the above embodiment, the following functions and effects can be obtained.

When the cover 33 is to be opened by means of the opener mechanism 35, the key 41 of the opener 37 is inserted into the key hole 67 of the cover 33 and turned 90 degrees in clockwise in FIG. 7(A). Then, two sliders 71 are synchronously sled downward by means of the operation of the cam 69 and the idle gear 85 to cause the locking pawl 75 to turn in counterclockwise, thus releasing the engagement with the engaged hole 83 as shown in FIG. 9(B). At the instant when the cover 33 is opened, the air stream 47, 48 (refer to FIG. 11(A)) is generated by the positive pressure applied to the high cleanliness room 5. At the same time, the dust is generated by the operation of the above-mentioned lock mechanism, i.e., the friction between the cam 69, the idle gear 85, the slider 71, and the locking pawl 75. Thus generated dust can be effectively prevented from flowing into the container and from contaminating therein. The reason thereof is described hereunder. More specifically, (1) Since the space formed by the reverse U-shaped portion comprising the inner flange 91, the base portion 89, and the outer flange 93 is closed in the rear (namely, the direction toward the rear portion of the container), the air stream 48 is hardly generated inside of the space. Accordingly, the dust generated and flown out of the window portion 81 of the locking pawl 75 which is located in the back side of the space is hardly carried by the air stream 48. More specifically, the dust can be effectively prevented from being carried by the air stream 48 around the front end of the frame portion of the container in the opening portion 49, i.e., the tip of the inner flange 91, into the inside of the container 11.

In other words, since the window portion 81 for the locking pawl 75 is located outward of the front end of the frame portion of the container in the opening portion 49, i.e., the tip of the inner flange 91, and backward thereof, the air stream is prevented from flowing in reverse.

(2) Furthermore, the generated air stream 48 passes the space between the outer flange 93 and the frame portion of the cover 33, and then flows directly into the low cleanliness room 7 through the engaged hole 83 which also functions as the vent hole. Accordingly, the air stream 48 is further effectively prevented from flowing in reverse around the tip of the inner flange 49.

In addition, since the engaged hole 83 additionally functions as the vent hole, the manufacture of the container 11 becomes easier in comparison with the case in which the engaged hole and the vent hole are provided separately.

In the above, the reason for preventing the dust from contaminating the container 11 is described in the case that the dust is generated by the friction in the lock mechanism. However, the dust is generated by other causes. Particularly, the friction between the cover 33 and the frame portion of the container in the opening portion 49 is another cause to generate the dust in addition to the lock mechanism 35. The reason for preventing the dust generated by the friction between the cover 33 and the frame portion of the container in the opening portion 49 from contaminating the inside of the container according to the present invention is described hereunder.

(1) Since the tapered guiding convex portion 123 is engaged with the tapered guiding concave portion 121, both of which have enough length of the protrusion or recession (refer to FIG. 10), the positioning of the cover 33 and the frame portion of the container in the opening portion 49 is effectively carried out, and then the cover 33 contacts the frame portion of the container in the opening portion 49, when the cover 33 is to be closed, thus preventing the dust from being generated. Whereas in the conventional apparatus, the cover contacts the frame portion of the container in the opening portion to generate the dust, because the positioning of the cover and the frame portion of the container in the opening portion is not sufficient.

(2) Since the gap 99 is formed between the inner surface of the inner flange 91 and the inner surface of the inner wall of the concave portion 97 as shown in FIG. 8, the friction between both of them can be prevented from being produced, thus preventing the dust from being generated in frame portions of the cover and the container 11 in the opening portion 49. Even if the outer surface of the inner flange 91 contacts the inner surface of the outer wall of the concave portion 97 because of the insufficient positioning of the frame portion of the container in the opening portion 49 and the cover 33, the friction by the above-mentioned contact occurs outward of the front end of the frame portion of the container in the opening portion 49, i.e., the tip of the inner flange 91, the dust generated by the friction can be prevented from flowing around the tip of the inner flange 91 into the inside of the container 11. Furthermore, with a wider gap 99, the dust is prevented from being generated in the frame portions of the cover and the container in the opening portion 49 even if the positioning of the frame portion of the container in the opening portion and the cover 33 is insufficient.

(3) In order to carry out the correct positioning of the frame portion of the container in the opening portion 49 of the cover 33, it is necessary that the opener mechanism 35 operates correctly, and that the sufficient positioning of the cover 33 and the opener mechanism 35 has to be carried out. The above-mentioned sufficient positioning can be attained by the use of the kinematic coupling between the opener 37 in the opener mechanism 35 and the cover 33. Thus, the dust can be prevented from being generated by the unnecessary friction between the cover 33 and the frame portion of the container in the opening portion 49.

Furthermore, according to the present invention, since the locking pawl 75 protrudes backward of the container and is engaged with the hitched portion as if the hitched portion is drawn toward the cover, the pressure power applied to the frame portion of the container in the opening portion 49 by the cover 33 increases, thus enabling a firm sealing of the container.

[Other embodiment]

Figure 11:
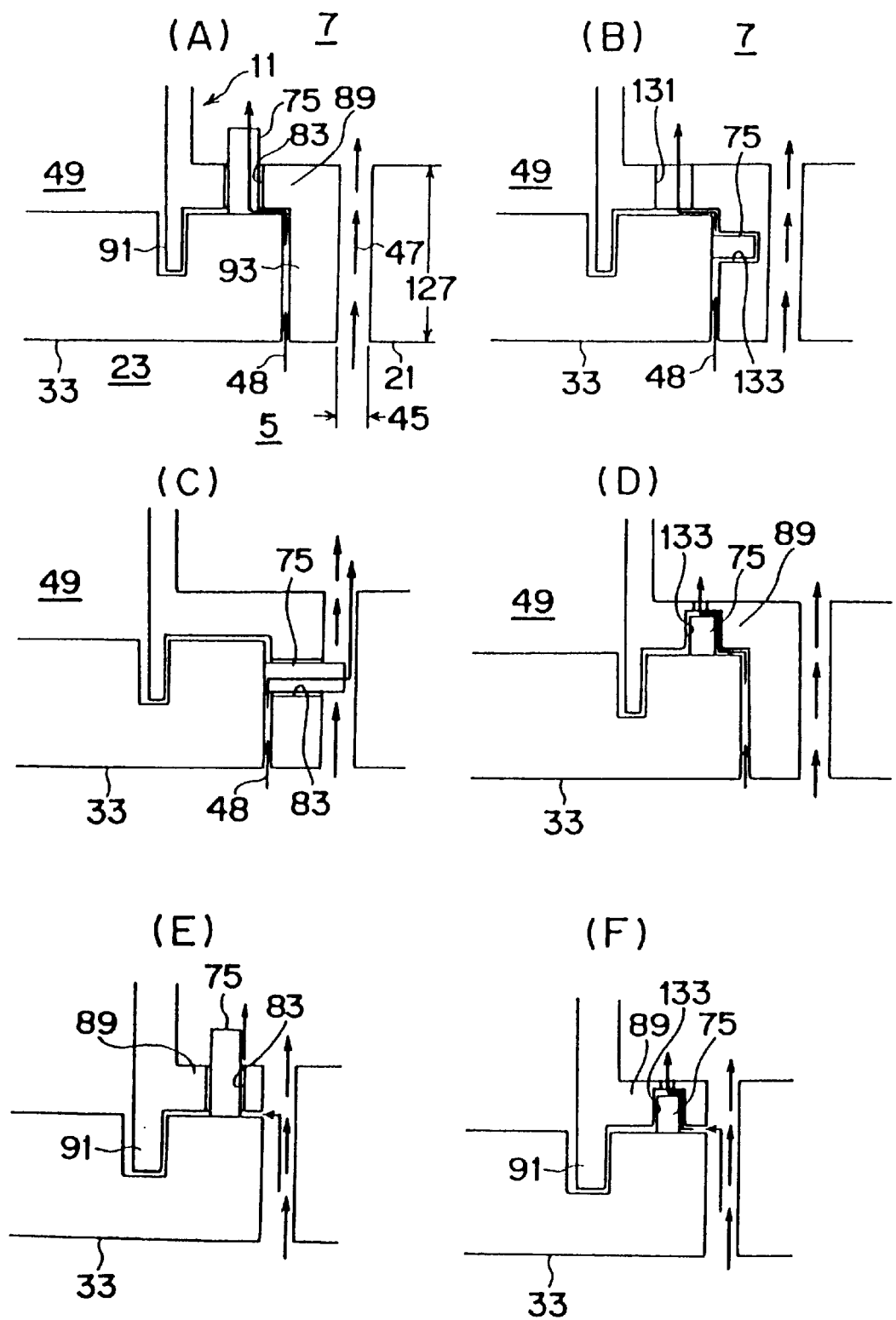
FIG. 11(A) is a schematic descriptive view illustrating the frame portion of the cover and the frame portion of the container in the opening portion shown in FIG. 8 together with the opening portion of the wall.
FIG. 11(B), (C), (D), (E) and (F) are schematic descriptive view illustrating other embodiments corresponding to FIG. 11(A)
Figure 12:
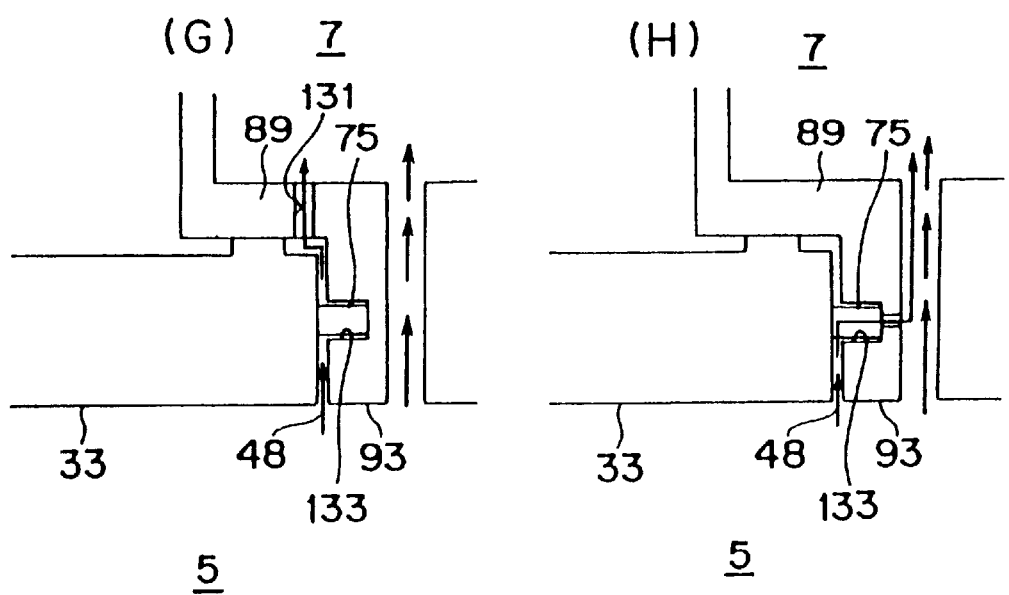
FIG. 12(G) and (H) are schematic descriptive view illustrating other embodiments corresponding to FIG. 11(A).

The cross-sectional view of the frame portion of the container in the opening portion 49 and the frame portion of the cover 33 has been described with reference to FIG. 8 in the above embodiment. However, in the present invention, other structures thereof are available as shown in FIGS. 11 and 12. More specifically, when the cover and the frame portion of the container shown in FIG. 8 are illustrated together with the opening portion of the wall, the descriptive view of the above becomes the view as shown in FIG. 11(A). In addition, the engaged hole 83 additionally functions the vent hole in the above embodiment. However, in the present invention, it is possible to provide the hitched portion 133 and the vent hole 131 separately as shown in FIG. 11(B). In this case, the locking pawl may protrudes not backward but outward, i.e., in the radius direction of the frame portion of the container in the opening portion 49. The air stream 48 directly flows through the vent hole 131 into the low cleanliness room 7.

Furthermore, as shown in FIG. 11(C), the locking pawl may protrudes outward of the frame portion of the container in the opening portion 49, and the engaged hole 83 with which the locking pawl is engaged additionally functions as the vent hole.

As shown in FIG. 11(D), the hitched portion 133 may not pierce through the base portion 89 of the frame portion of the container in the opening portion 49. In this case, a part of the back portion of the hitched portion 133 may be pierced through and caused to function as the vent hole.

Furthermore, the frame portion of the container in the opening portion 49 has the inner flange 91, the base portion 89 and the outer flange 93. However, in the present invention, as shown in FIGS. 11(E) and (F), for example, the frame portion of the the container in the opening portion 49 may have the inner flange 91 and the base portion 89 without the outer flange 93. Without the outer flange 91, FIG. 11(E) is the same as FIG. 11(A), and FIG. 11(F) is the same as FIG. 11(D).

In addition, in the present invention, as shown in FIGS. 11(G) and (H), for example, the frame portion of the container in the opening portion 49 may have the base portion 89 and the outer flange 93 without the inner flange 93. In this case, the vent hole 131 is preferably formed in the base portion 89 near the hitched portion 133 so that the air stream carrying the dust, which flows out of the window portion 81 (refer to FIG. 8) for the locking pawl 75, directly flows into the low cleanliness room 7 (refer to FIG. 11(G)). In addition, a part of the back portion of the hitched portion 133 may be pierced through and caused to function as the vent hole, thus flowing the air stream 48 directly into the low cleanliness room 7.

Furthermore, in connection with the guiding convex portion 123 and the guiding concave portion 121 to carry out the positioning of the cover 33 and the frame portion of the container in the opening portion 49, the guiding convex portion 123 is formed on the cover and the guiding concave portion 121 is formed on the frame portion of the container in the opening portion 49 in the above embodiment. However, the relationship thereof may be in reverse in the present invention.

Two pairs of the guiding concave portion 121 and the guiding convex portion 123 are formed in the above embodiment. However, three or four pairs thereof may be formed in the present invention.

In addition, the kinematic coupling is used for the positioning of the cover 33 and the opener mechanism 35 in the above embodiment. However, other means of the positioning may be employed in the present invention.

The opener mechanism 35 is provided in the low cleanliness room along the border between the high cleanliness room 5 and the low cleanliness room 7 in the above embodiment. However, the opener mechanism may be provided in the high cleanliness room 8. Since the dust generated in the lock mechanism 65 flows out of the window portion 81 for the locking pawl 75 at the instant when the lock mechanism is unlocked, i.e., the locking pawl 75 is disengaged with the hitched portion to release the cover 33, the contamination of the container is expected to be prevented by means for treating the dust in that instant not to contaminate the inside of the container 11.

In order to open and close the cover 33, the opener 37 moves upward and downward, and the stage on which the container 11 is mounted moves forward and backward in the above embodiment. However, the stage 13 on which the container 11 is mounted may not move forward and backward, while the opener 37 moves forward and backward as well as moves upward and downward by the opener mechanism. More specifically, after the stage on which the container is mounted is positioned in a prescribed location, the opener 37 is raised and caused to approach (or retreat) the container 11, and then, after releasing the lock mechanism, the opener 37 is retreated from the container (or moved forward) and lowered.

The stage 13 is moved forward and backward by the driving mechanism 31 in the above embodiment. However, the driving mechanism may not be provided in the present invention. For example, bearings, wheels or rollers may be furnished and the stage 13 may be moved forward and backward by human power or robots.

As described above, according to the present invention, it is possible to prevent the inside of the container in which the detesting dust article such as the silicon wafer is received and transported from being contaminated by the dust generated when the cover of the container is opened and closed.

The detesting dust article received and transported by the container of the present invention may be the semiconductor substrate such as the liquid crystal substrate, and the article in the medical field, and therefore is not limited to the silicon wafer.

What is claimed is:

1. A container for receiving and transporting a detesting dust article, which is mounted on a loader disposed in a border portion between a high cleanliness room and a low cleanliness room, a cover of which is opened and closed by an opener mechanism disposed in said loader in such manner that an opening portion of said container and said high cleanliness room is connected and shut, which includes:

(a) a lock mechanism disposed in said cover and operated by said opener mechanism provided in said loader for locking and releasing said cover;

(b) a locking pawl in said lock mechanism for protruding from a frame portion of said cover and catching a hitched portion provided in a frame portion of said container in said opening portion; and (c) a window portion provided in said frame portion of said cover, from which said locking pawl protrudes, said window portion being disposed so as to be located outward and backward of a front end of said frame portion of said container in said opening portion, when said locking pawl is hitched to said hitched portion provided in said frame portion of said container in said opening portion.

2. A container as claimed in claim 1, wherein said frame portion of said container in said opening portion comprises said hitched portion which is located between said inner flange and said outer flange, said window portion for said locking pawl is located in said hitched portion when said locking pawl is hitched to said hitched portion, and said frame portion of said container comprises a tip of said inner flange.

3. A container for receiving and transporting a detesting dust article as claimed in claim 1, which further comprises:

(a) a taper-shaped guiding convex portion or a taper-shaped guiding concave portion formed at a portion on an inner side of said cover with which said frame portion of said container in said opening portion contacts;

(b) a taper-shaped guiding concave portion or a taper-shaped guiding convex portion for being correspondingly fixed to said taper-shaped guiding convex portion or said taper-shaped guiding concave portion formed in said cover, formed at a portion on said frame portion of said container in said opening portion with which said inner side of said cover contacts.

4. A container for receiving and transporting a detesting dust article as claimed in claim 1, which further comprises:
   (a) said frame portion having an inner flange formed at an inner side of said frame portion and an outer flange formed at an outer side of said frame portion of said container in said opening portion;
   (b) said cover closing said opening portion by covering an inner side of said outer flange;
   (c) a ring-shaped concave portion formed at an inner side of said cover for being fixed to said inner flange; and
   (d) a gap formed between an inner surface of said inner flange and an inner wall at an inner side of said ring-shaped concave portion.

5. A container as claimed in claim 1, wherein a kinematic coupling is disposed between said opener mechanism and said cover, which cover is closed and opened by said opener mechanism, for positioning of said opener mechanism and said cover.

6. A container for receiving and transporting a detesting dust article, which is mounted on a loader disposed in a border portion between a high cleanliness room and a low cleanliness room, a cover of which is opened and closed by an opener mechanism disposed in said loader in such manner that an opening portion of said container and said high cleanliness room is connected and shut, which includes:
   (a) a lock mechanism disposed in said cover and operated by said opener mechanism provided in said loader for locking and releasing said cover;
   (b) a locking pawl in said lock mechanism for protruding from a frame portion of said cover and catching a hitched portion provided in a frame portion of said container in said opening portion;
   (c) a window portion provided in said frame portion of said cover, from which said locking pawl protrudes, said window portion being disposed so as to be located outward of a front end of said frame portion of said container in said opening portion, when said locking pawl is hitched to said hitched portion provided in said frame portion of said container in said opening portion; and
   (d) a vent hole provided in said frame portion of said container outward of said front end of said frame portion of said container for connecting to said low cleanliness room.

7. A container as claimed in claim 6, wherein said hitched portion comprises an engaged hole, and said engaged hole functions as said vent hole.

8. A container as claimed in claim 6, wherein said vent hole functions as a ventilating hole and said hitched portion.

9. A container for receiving and transporting a detesting dust article, which is mounted on a loader disposed in a border portion between a high cleanliness room and a low cleanliness room, a cover of which is opened and closed by an opener mechanism disposed in said loader in such manner that an opening portion of said container and said high cleanliness room is connected and shut, which includes:
   (a) a lock mechanism disposed in said cover and operated by said opener mechanism provided in said loader for locking and releasing said cover;
   (b) a locking pawl in said lock mechanism for protruding from a frame portion of said cover and catching a hitched portion provided in a frame portion of said container in said opening portion;
   (c) a window portion provided in said frame portion of said cover, from which said locking pawl protrudes, said window portion being disposed so as to be located at a portion through which air stream flows directly toward said low cleanliness room, said air stream being generated by a positive pressure applied to said high cleanliness room at an instance when said locking pawl is disengaged from said hitched portion to release said cover.

* * * * *